United States Patent [19]

Nicollini et al.

[11] Patent Number: 4,780,624

[45] Date of Patent: Oct. 25, 1988

[54] BIMOS BIASING CIRCUIT

[75] Inventors: Germano Nicollini, Piacenza, Italy; Daniel Senderowicz, Berkeley, Calif.

[73] Assignee: SGS Microelettronica s.p.a., Cantania, Italy

[21] Appl. No.: 38,745

[22] Filed: Apr. 15, 1987

[30] Foreign Application Priority Data

Apr. 18, 1986 [IT] Italy .............................. 20132 A/86

[51] Int. Cl.⁴ ........................ H03K 3/01; H03K 19/02; G05F 1/40; H03F 3/04

[52] U.S. Cl. ................................ 307/296 R; 307/297; 307/446; 307/544; 307/570; 307/572; 307/304; 330/288; 323/314

[58] Field of Search .................... 307/296 R, 297, 570, 307/572, 544, 446, 304; 330/288; 323/313-314

[56] References Cited

U.S. PATENT DOCUMENTS 4,558,242 12/1985 Tuthill et al. ...................... 307/297
4,695,750 9/1987 Hara .................................. 307/446

FOREIGN PATENT DOCUMENTS 0183185 6/1986 European Pat. Off. ........... 323/313
0245007 12/1985 Japan ................................. 323/313

*Primary Examiner*—John S. Heyman
*Assistant Examiner*—M. R. Wambach
*Attorney, Agent, or Firm*—Wolf, Greenfield & Sacks

[57] ABSTRACT

The circuit comprises a first and a second transistor provided with the sources coupled to one end of a supply voltage and the gates coupled to one another, and a third and fourth transistor provided with the sources coupled to the other end of the supply voltage, the gates coupled to one another, the drains coupled to the respective drains of said first and second transistor, and the gates of the first and of the fourth transistor being furthermore shorted each with its own gate. The coupling between the drains of the first and of the third transistor is constituted by a preset resistor to the ends of which the base and the emitter of a bipolar transistor are coupled having the collector of the bipolar transistor coupled to one end of the supply voltage. The four transistors may be replaced by respective pairs of transistors suitably coupled to each other.

5 Claims, 3 Drawing Sheets

BIMOS BIASING CIRCUIT

FIELD OF THE INVENTION

The present invention relates to a circuit for biasing MOS integrated devices, particularly of the digital-analogic mixed type, such as PCM filters, Combo circuits, modems and other similar devices.

PRIOR ART

With the aim of making use of the very high density of MOS technology VLSI digital circuits, mixed digital-analog circuits have been recently developed, particular PCM filers, Combo circuits, modems etc., in which the analog element is typically the operation amplifier.

The coexistence of digital and analog elements on the same integrated circuit entails mutual noise, particularly of the digital portion of the analog one, since the continuous switching on and off of the digital elements produces pulse noise on the power supplies, thus appearing as noise added to the analog portions.

Moreover, in many chips there is mutual noise between different sections of the same analog portion, e.g. between the signal transmitter section and the signal receiver section. Since the power supply has a finite resistance, when the biasing currents are modulated by the signal present in one of the two sections, a voltage is produced on the power supply which is proportional to the signal which affects the other section, according to the phenomenon known as "crosstalk".

Another problem is furthermore represented by the fact that some analog circuits must be able to operate correctly, that is without appreciable variations of the biasing currents, even if the power supply varies within a rather wider range.

To solve the above described problems, in the mixed integrated circuits biasing circuits have been included which supply practically constant biasing currents, regardless of the noise and/or of the power supply value on the operational amplifiers. The typical operational amplifier requires two biasing currents, respectively, for the differential stage and for the gain stage, which are generated by respective transistors. The value of each current I depends almost exclusively, once the process conditons and the dimensions have been set, on the approximate formula:

$$I=k(V_{GS}-V_T)^2,$$

where $V_{GS}$ is the gate-source voltage, $V_T$ is the transistor threshold voltage, and k is a constant typical of the particular MOS transistor, which will be described hereinafter. From the above equation it can be observed that in order to keep the biasing current constant it is necessary to make the voltage which drives the gates of the respective transistors follow exactly the supply to which it is related, without being affected by the other supply, and this independence is indeed the aim of the biasing circuit.

A parameter often used to indicate the extent to which a signal (within a desired range of frequencies typically 0-50 kHz) present on a supply is coupled on a biasing coupling, referred to the other supply, is PSRR measured in db, the biasing circuit being more effective as the PSRR decreases.

One of the most elementary biasing circuits of the current art is illustrated by way of example in FIG. 1, which will be described hereinafter. The circuit has a PSRR typically greater than −12 dB. Other and more advanced solutions of the prior art are Widlar's circuit and Wilson's circuit, respectively, illustrated in FIGS. 2 and 3, and which will also be described hereinafter, and which have better PSRRs, typically ranging between −20 and −40 dB.

However, both Widlar's circuit and Wilson's circuit make use of a positive feedback which introduces instability and oscillation risks in the circuit. More in particular, Widlar's circuit requires a compensation (through a capacitor) of the trend of the gain to increase for the high frequencies thereby dispersing the layout of the integrated circuit. Moreover, the current of the biasing circuit, which is repeatedly mirrored in the current generators of the operational amplifiers, depends, as will be described hereinafter, on three independent factors, and therefore features three degrees of uncertainty, which vary in the making process, and which lead to an extended variation range within which the current can vary from one chip to the other, with the consequent need to impose more stringent design restrictions on the operational amplifiers being supplied.

Wilson's circuit is provided with a loop gain which is smaller than Widlar's, but this one also requires a capacitive compensation at the high frequencies, and its biasing current also has three degrees of uncertainty relating to the fabrication process.

The main aim of the present invention is therefore to provide a biasing circuit which, is provided with a margin of stability which is much greater than in the known circuits, simultaneously generating a current provided with only one degree of uncertainty, and thus controllable, during the making, within a smaller variation range than in the known circuits.

SUMMARY OF THE INVENTION

Other objects and advantages, such as will become apparent hereinafter, are achieved by the invention with a circuit for biasing CMOS integrated devices, particularly of the digital-analogic mixed type, comprising a first and a second transistor provided with the sources coupled to one end of a supply voltage and the gates coupled to one another, and a third and fourth transistor provided with the sources coupled to the other end of the supply voltage the gates being coupled to one another, the drains coupled to the respective drains of said first and second transistor, the gates of the first and of the fourth transistor being furthermore shorted each with its own gate characterized in that the coupling between the drains of the first and of the third transistor is constituted by a preset resistor to the ends of which are coupled the base and the emitter of a bipolar transistor having the collector coupled to one end of the supply voltage.

A preferred embodiment of the invention will now be described, given by way of non-limitative example with reference to the accompanying drawings, where:

Figure 1:
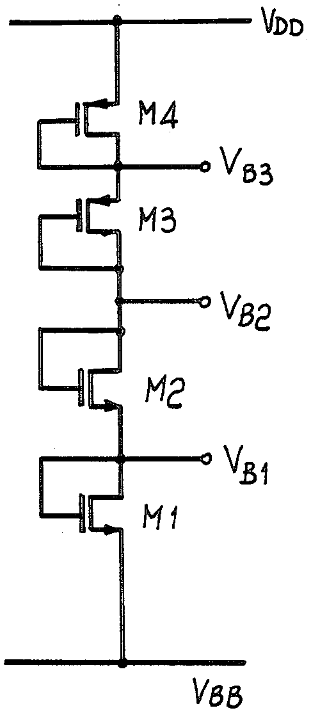
FIG. 1 is a circuit diagram of an elementary biasing circuit according to the prior art.
Figure 5:
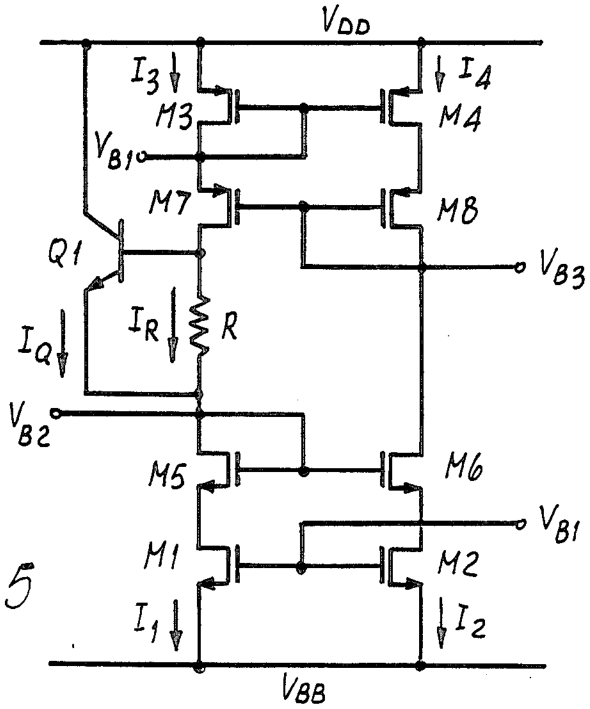
Figure 6:
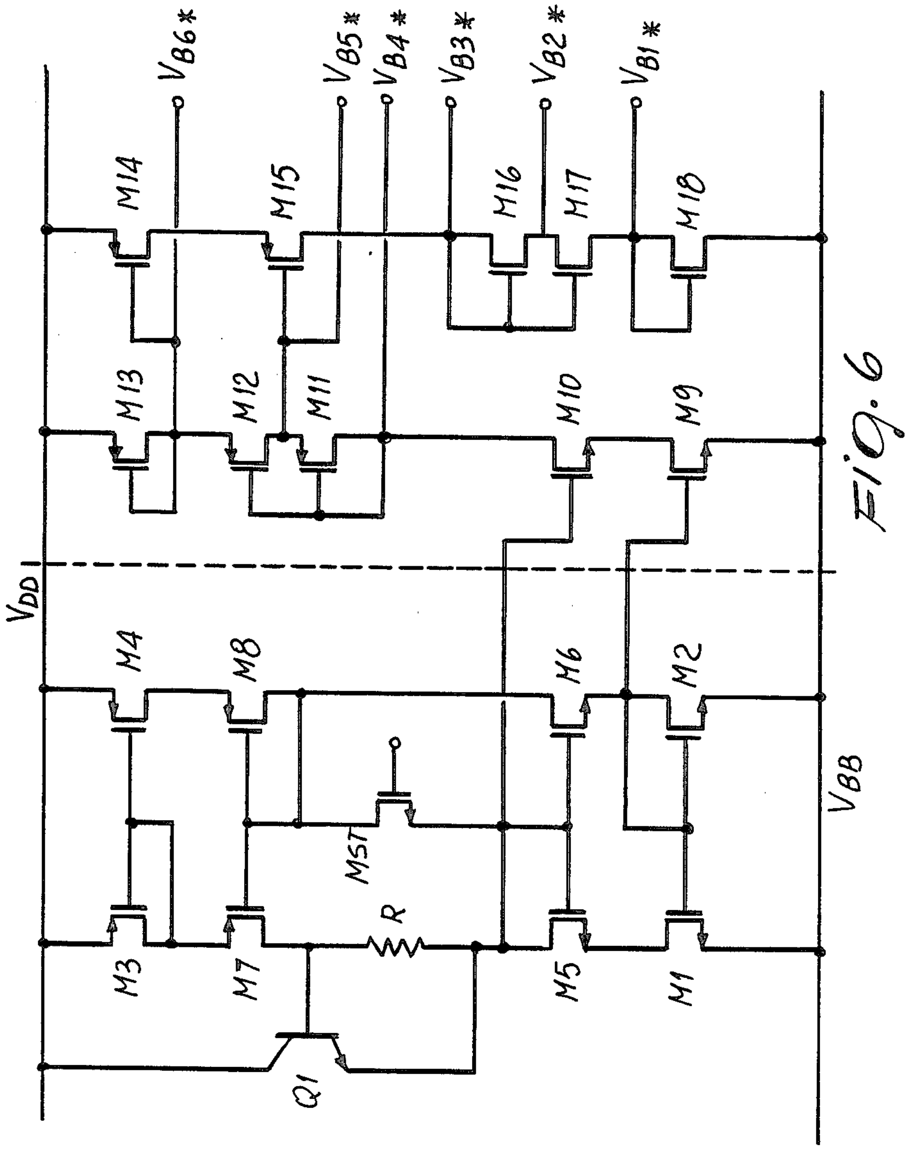

FIG. 5 is a circuit diagram of a second preferred embodiment of a biasing circuit according to the invention; and FIG. 6 is a circuit diagram of a third preferred embodiment of a biasing circuit according to the invention With reference to FIG. 1, said elementary solution of a biasing circuit according to the prior art is a divider formed by MOS transistors M1, M2, M3, M4, diode coupled (that is, with the gate and drain mutually shorted) coupled between the high supply voltage $V_{DD}$ and the low supply voltage $V_{BB}$. Biasing voltages $V_{B1}$, $V_{B2}$, $V_{B3}$ are derived from the nodes between one transistor and the other. It is obvious that in a circuit of this kind the noise couples to the various nodes through a partition of equivalent resistors which are all more or less of the same order of magnitude.

Figure 2:
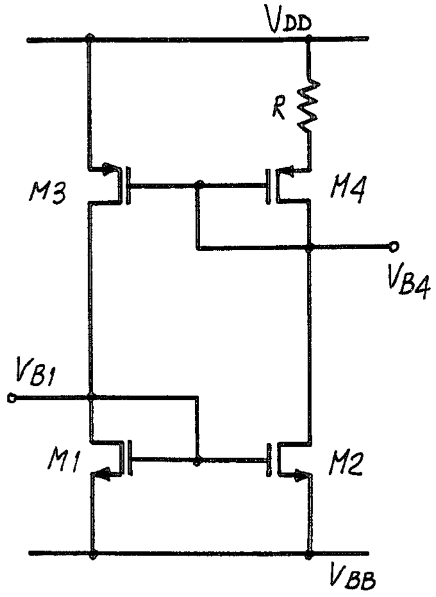
FIG. 2 is a circuit diagram of a Widlar biasing circuit.

With reference now to FIG. 2, Widlar's circuit comprises a first and a second transistor M1, M2, provided with their sources connected to a low or more negative supply voltage $V_{BB}$, and a third and fourth transistor M3, M4, provided with their sources coupled to a high or more positive supply voltage $V_{DD}$, with a resistor R inserted in series with respect to the source of the fourth transistor M4. The first and the fourth transistor M1, M4 have their gates respectively shorted, each with its own drain, to provide a diode coupling, and finally the drains, respectively, of the first and of the second are coupled to the drains of the third and fourth transistor. Biasing voltages $V_{B1}$ and $V_{B4}$ are taken from the nodes between the drains of the respective transistors, the first being referred to as $V_{BB}$, the second as $V_{DD}$.

Besides the already described disadvantage of the use of a positive feedback with a high loop gain, which is a potential source of instability, this circuit furthermore has the disadvantage that the current depends both on the resistor R, and on the k of the transistors M3, M4, defined as:

$$k=\mu C_o * W/L,$$

where $\mu$ is the mobility of the charge carriers of the transistor channel, $C_o$ is the oxide layer capacity, W is the channel width and L the channel length. The current thus depends on three mutually independent parameters (R, $\mu$ and $C_o$) of the making process, and is thus subject to the three degrees of uncertainty mentioned in the introduction.

In order to further improve the PSRR, the making is known of Widlar's circuit with the addition of other transistors suitably coupled to the transistors M1, M2, M3, M4, providing respective two-transistor cascade arrangements, and furthermore obtaining a double number of biasing voltages which can be used in output.

Figure 3:
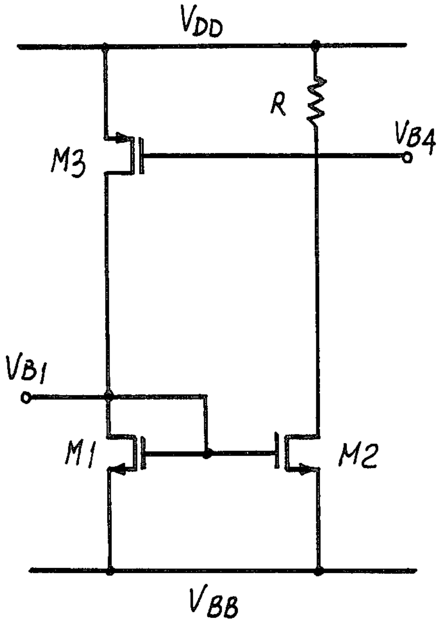
FIG. 3 is a circuit diagram of a Wilson biasing circuit.

FIG. 3 illustrates Wilson's circuit. This one, too, comprises a first and a second transistor M1, M2, their sources being coupled to a low supply voltage $V_{BB}$, and a third transistor M3, the source being coupled to a high supply voltage $V_{DD}$. The first transistor M1 is provided with the gate shorted with its own drain, to provide a diode coupling, and finally the drains of the first and the third transistor are coupled with each other, while a resistor R is inserted in series between the drain of the second transistor M2 and the voltage $V_{DD}$. The drain of the second transistor M2 furthermore drives the gate of the third transistor M3. Biasing voltages $V_{B1}$ and $V_{B4}$ are taken from the nodes between the drains of the respective transistors, the first being referred to as $V_{BB}$, the second as $V_{DD}$.

Wilson's circuit features a smaller loop gain than Widlar's circuit, and is therefore more stable, but it, too, requires compensation at the high frequencies, and moreover the biasing current depends here on the resistor R and on the k of the transistor M3, defined as above, and thus the three degrees of uncertainty are unchanged.

Also in Wilson's circuit, in order to improve the PSRR, the addition is known of further transistors suitably coupled to the transistors M1, M2, M3 and M4, thus furthermore achieving a double number of biasing voltages which can be used in output.

Figure 4:
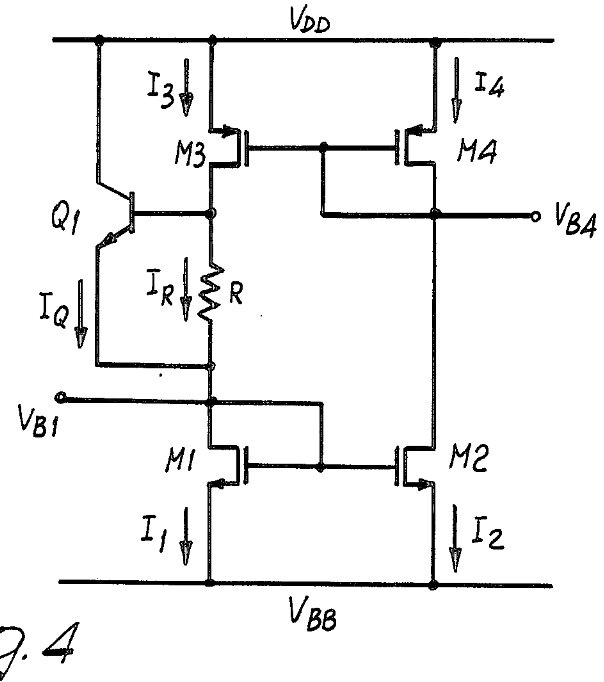
FIG. 4 is a circuit diagram of a first preferred embodiment of a biasing circuit according to the invention.

According to the invention, in a biasing circuit provided similarly to Widlar's circuit a negative feedback is introduced to offset the positive feedback effect, and a preferred embodiment of said circuit according to the invention is illustrated in FIG. 4.

The circuit according to the invention comprises a first and a second transistor M1, M2, provided with the sources coupled to a low supply voltage $V_{BB}$, and a third and fourth transistor M3, M4, provided with the sources coupled to a high supply voltage $V_{DD}$, with a resistor R inserted in series between the drains of the transistors M1 and M3, while the drains of transistors M2 and M4 are directly coupled to one another. The first and the fourth transistor M1, M4 are provided with their gates respectively shorted, each with its own drain, to provide a diode coupling.

A bipolar transistor Q1 has the collector coupled to the high supply voltage $V_{DD}$, the emitter coupled to the low end of the resistor R and the base driven by the high end of the resistor R.

Biasing voltages $V_{B1}$ and $V_{B4}$ are taken from the nodes between the drains of the respective transistors, the first being referred to as $V_{BB}$, the second as $V_{DD}$.

If in the circuit of FIG. 4, taking into account that the transistors M3 and M4 form a current mirror, the width to length ratio W/L of the channel is imposed equal for the two transistors, then consequently $$I_3=I_4.$$

There being no leakage paths for the right branch of the circuit, then consequently $$I_2=I_3=I_4.$$

If the condition is furthermore imposed that the W/L ratio of the transistor M1 is equal to c times the W/L ratio of the transistor M2, with $c>1$ consequently $$I_1=cI_2=cI_3=cI_4.$$

Therefore the emitter current of the bipolar transistor Q1 will be $$I_Q=I_1-I_3=(c-1)I_3,$$

and this current develops on the transistor Q1 a base-emitter voltage $V_{BE}$, simultaneously imposing a current in the resistor equal to:

$$I_R=V_{BE}/R$$

This last equation therefore defines the current which circulates in the biasing circuit, since $I_3=I_R$, at less than the base current of the bipolar transistor, which can be considered negligible. Thus in practice this current depends only on the value of R, since the $v_{BE}$ of the bipolar transistor is a very precise value, once the process is defined.

The extremely low loop gain (which is an indication of a high margin of stability) derives from the fact that the bipolar transistor induces a negative feedback on the current of the main circuit, which is equivalent to giving a lower positive feedback.

It should be furthermore noted that the addition of a bipolar transistor with the collector coupled to the more positive supply voltage $V_{DD}$ does not require the use of any additional mask in the CMOS processes.

The circuit described with reference to FIG. 4, similarly to what has been described for the Widlar and Wilson circuits, can be achieved also by adding further transistors suitably coupled to the transistors M1, M2, M3, M4. FIG. 5 illustrates a solution of this kind, also having the advantage of providing four separate biasing voltages $V_{B1}$, $V_{B2}$, $V_{B3}$, $V_{B4}$. It is deemed superfluous to describe in detail the operation of this circuital solution, since it is obvious on the basis of what has been described with reference to FIG. 4. It should be merely observed that the design restrictions imposed between the transistors M3 and M4 in the circuit of FIG. 4 must be imposed here also to the transistors M7 and M8, and that the restrictions between M1 and M2 in FIG. 4 must be valid here also between the transistors M5 and M6.

FIG. 6 is a diagram in which the basic circuit described above with reference to FIGS. 4 and 5 is also provided with a start-up transistor and is moreover completed by an interface circuit, intended both to provide biasing voltages with a different value or a in greater number with respect to those supplied by the basic circuit, and to decouple the basic circuit from eventual noise or injections of charges produced by the downstream operational amplifiers.

The part to the left of the broken line in FIG. 6 is the basic circuit, identical to the one of FIG. 5, except for the presence of a further transistor MST coupled between the gate of the transistors M5 and M7 (which coincide with the gates of M6 and M8). Since the biasing circuits which employ the positive reaction have two stable operating states, one with current circulating, the other with zero current the application of an impulse to the MST transistor ensures that the basic circuit assumes the desired stable operating state that is the one will current circulating.

The interface circuit, illustrating to the right in broken lines, is constituted by two current mirrors which comprise the transistors M9, M10, . . . , M18, and supplies six biasing voltages $V_{B1^*}$, $V_{B2^*}$, . . . , $V_{B6^*}$.

A number of preferred embodiments of the invention have been described, but naturally they are susceptible to equivalent modifications and variations, within the scope of the teachings of the invention.

What is claimed is:

1. Circuit for biasing CMOS integrated devices, particularly of the digital-analog mixed type, comprising a first and a second transistor each having a gate, drain and source, and provided with the sources coupled to one end of a supply voltage and the gates coupled to one another, and a third and fourth transistor each having a gate, drain and source, and provided with the sources coupled to the other end of said supply voltage, the gates coupled to one another, the drains coupled to the respective drains of said first and second transistors, the gates of the first and of the fourth transistor being furthermore shorted each with its own drain said improvement comprising, a bipolar transistor, having a base, emitter and collector, and a preset resistor coupled between the drains of the first and of the third transistor the base and the emitter of said bipolar transistor coupled across said resistor, the collector of said bipolar transistor coupled to one end of said supply voltage.

2. Circuit for biasing CMOS integrated devices, particularly of the digital-analog mixed type, comprising a first and a second two-transistor cascade arrangement with each transistor having a gate, drain and source and with the cascade arrangement having free sources, provided with the free sources thereof coupled to an end of a supply voltage, and the gates coupled to one another, and a third and fourth transistor cascade arrangement with each transistor having a gate, drain and source and with the cascade arrangement having free sources, provided with the free sources thereof coupled to the other enad of said supply voltage, the gates coupled to one another, the free drains coupled to the respective free drains of said first and second transistor cascade arrangements, the gates of one of the transistors of each of said cascade arrangements being furthermore shorted each with its own drain, said improvement comprising, a bipolar transistor having a base, emitter, and collector, and a preset resistor coupled between the free drains of the first and third transistor cascade arrangement the base and the emitter of said bipolar transistor coupled across said resistor, the collector of said bipolar transistor coupled to one end of said supply voltage.

3. Biasing circuit according to claim 1, characterized in that an additional starting transistor is provided with the source and the drain thereof coupled, respectively, to the gates of said first and third transistor.

4. Biasing circuit according to claim 2, characterized in that an additional starting transistor is provided with the source and the drain thereof coupled, respectively, to the gates of the intercoupled gate transistors of said first and third two-transistor cascade arrangements.

5. Biasing circuit according to claim 1 characterized in that it furthermore comprises an interface driven by one or more of its output voltages constituted by at least one current mirror, suitable for providing downstream more biasing voltages, decoupling at the same time the upstream circuit from the effects of the load.

* * * * *